United States Patent [19]

Mansfield

[11] 4,165,479

[45] Aug. 21, 1979

[54] NUCLEAR MAGNETIC RESONANCE APPARATUS AND METHODS

[75] Inventor: Peter Mansfield, Chilwell, England

[73] Assignee: National Research Development Corporation, London, England

[21] Appl. No.: 860,217

[22] Filed: Dec. 13, 1977

[30] Foreign Application Priority Data

Dec. 15, 1976 [GB] United Kingdom ............... 52322/76

[51] Int. Cl.² ........................................... G01R 33/08
[52] U.S. Cl. ............................................... 324/0.5 A
[58] Field of Search ......... 324/0.5 R, 0.5 A, 0.5 MA, 324/0.5 H, 0.5 AC

[56] References Cited

U.S. PATENT DOCUMENTS 4,070,611  1/1978  Ernst .................................. 324/0.5 R Primary Examiner—M. Tokar
Attorney, Agent, or Firm—Cushman, Darby & Cushman

[57] ABSTRACT

The nuclear magnetic resonance spin density distribution in a sample is obtained by subjecting the sample to a static magnetic field and exciting the sample with a selective or non-selective r.f. excitation pulse and a combination of magnetic field gradients which vary in directions along and orthogonal to the direction of the static field. One or more of the gradients are repetitively reversed to allow cyclic regrowth and decay of the free induction decay signal.

21 Claims, 23 Drawing Figures

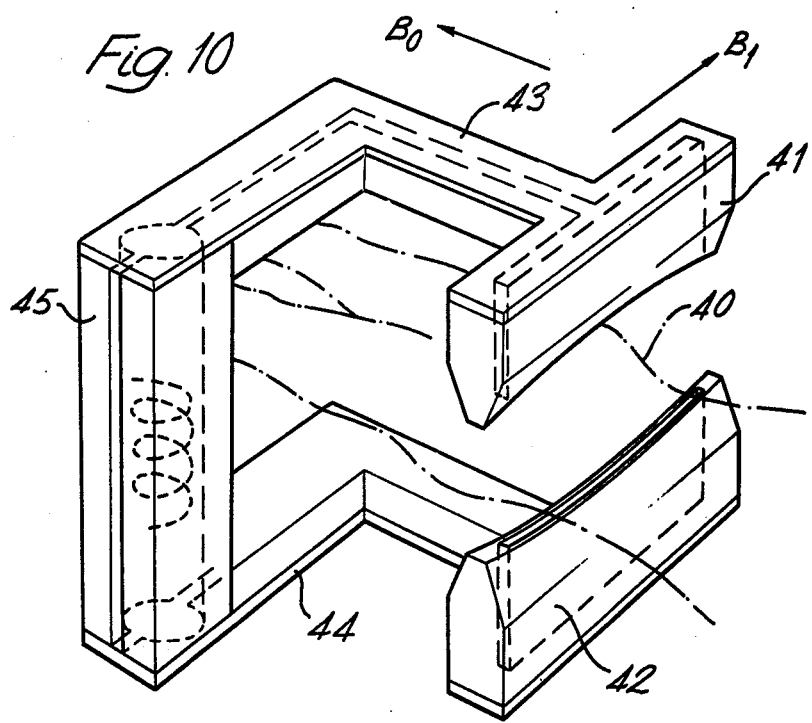
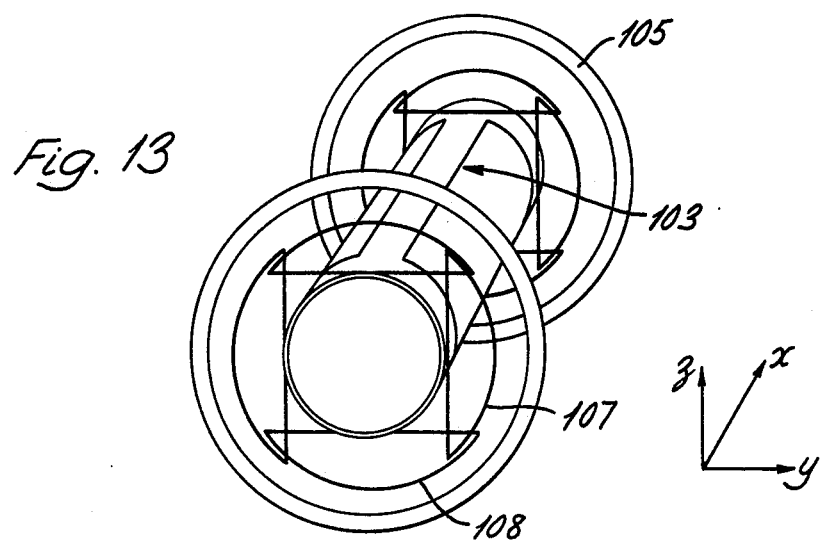

NUCLEAR MAGNETIC RESONANCE APPARATUS AND METHODS

This invention relates to nuclear magnetic resonance apparatus and methods. It is concerned with the formation of two and three dimensional images of the spin density distribution in material containing nuclear spins.

One imaging system enables a spin density image of a specimen to be produced from a plurality of line elements spaced apart in a grid-like pattern and lying in a plane or set of planes of the specimen by the selective excitation of regions therein in the presence of a static magnetic field and sequentially switched magnetic field gradients orthogonal to each other. The selective excitation is followed by the subsequent read-out of the resultant free induction decay signal in the presence of a combination of magnetic field gradients simultaneously applied such that each point in the selected line elements is subjected to a resultant magnetic field of amplitude unique to that point. By this means imaging formation is obtained from all the line elements simultaneously.

According to the present invention spatial selectivity in a preselected plane or set of planes in a specimen, or else in the entire volume of the specimen is obtained by subjecting the specimen to a combination of three magnetic field gradients orthogonal to each other at least one of which gradients is periodically reversed in oscillatory fashion so that the free induction signal from the nuclei decays and re-grows cyclically in consequence of the said gradient reversal.

Where an image of a single plane or set of planes is required then such plane or planes may be pre-selected by the previously described method in which case one of the gradients is periodically reversed and information is obtained from the selected plane or planes alone.

Alternatively initial selection of planes need not be carried out in which case the entire volume is subjected to an initial 90° pulse which nutates all of the spins and two of the gradients are periodically reversed in synchronism, with one reversal rate being a multiple of the other and the third gradient is applied statically. The output signal represents information relating to the entire volume of the specimen.

While the gradient reversals may be obtained by rapid switching this is not essential and sinusoidally varying gradients may be applied.

In order that the invention may be more fully understood reference will now be made to the accompanying drawings in which.

Figure 1:
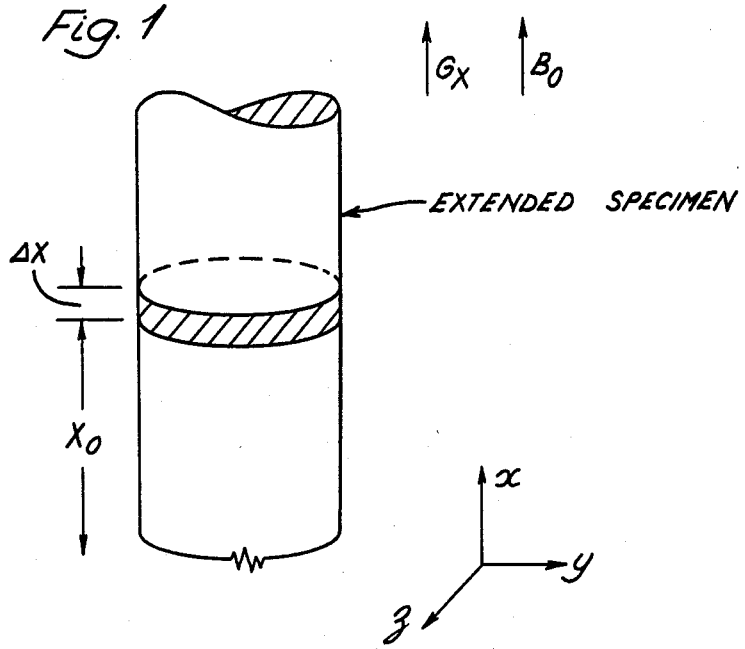
FIG. 1 is a diagram showing the preselection of a single layer in an extended specimen.
Figure 4:
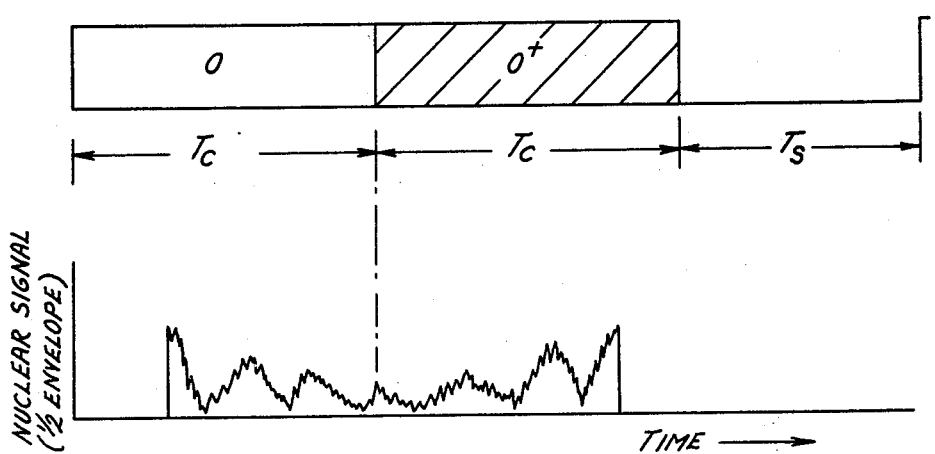
Figure 2:
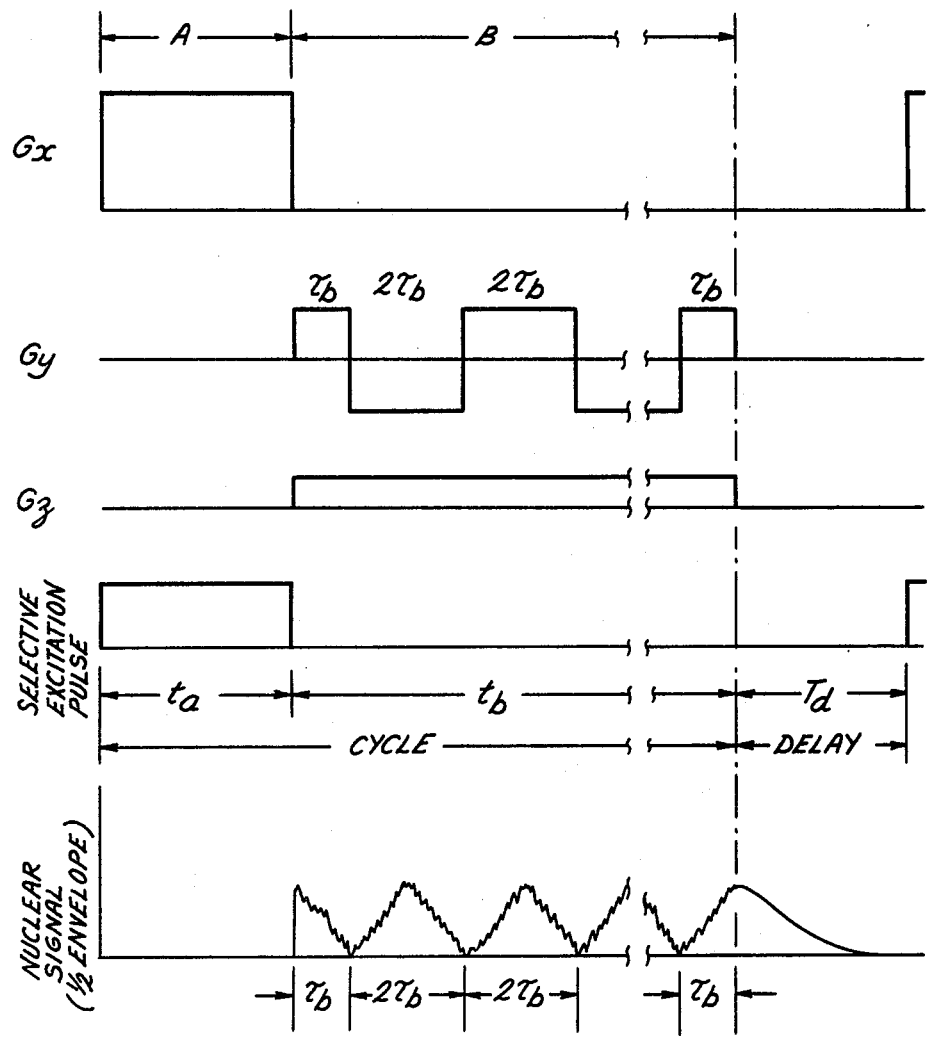
FIG. 2 illustrates a switching sequence for obtaining information from the selected layer.
Figure 3A:
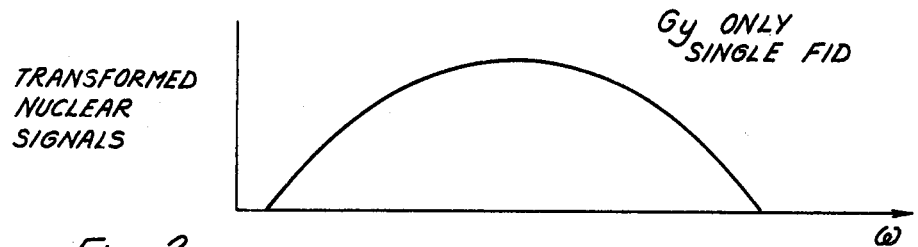
Figure 3B:
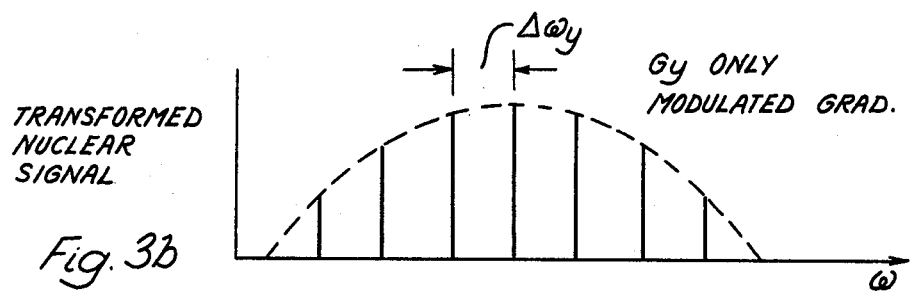
Figure 3C:
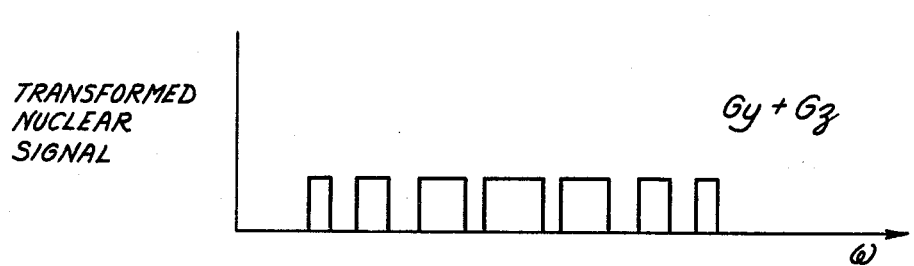
Figure 5:
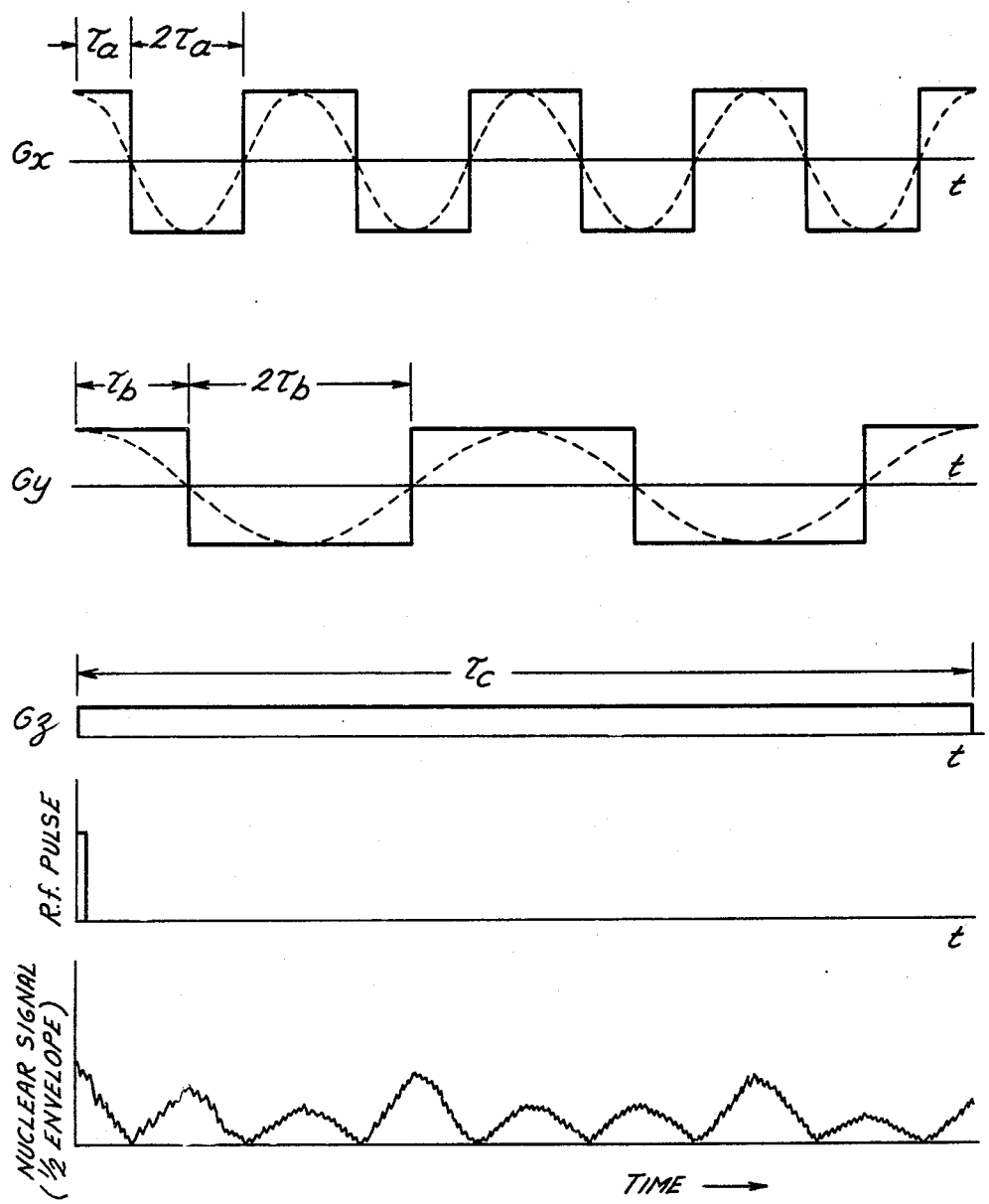
Figure 6A:
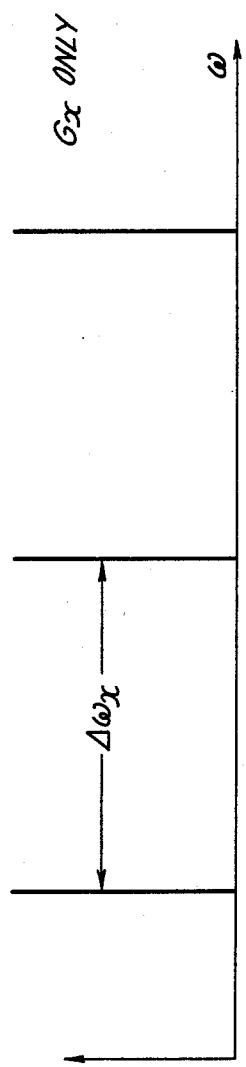
Figure 6B:
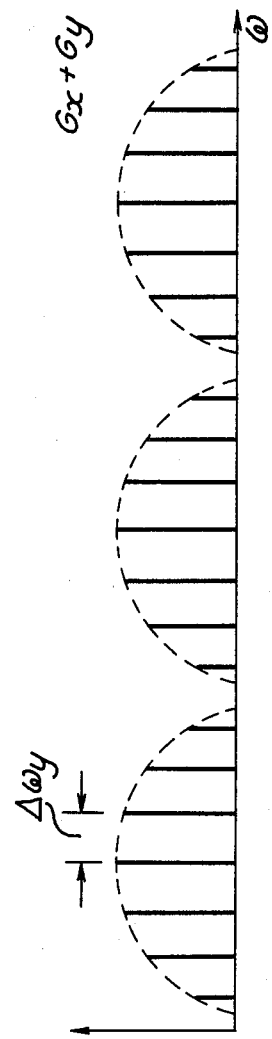
Figure 6C:
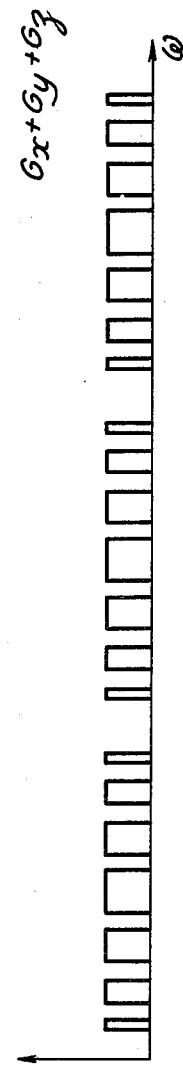
Figure 7:
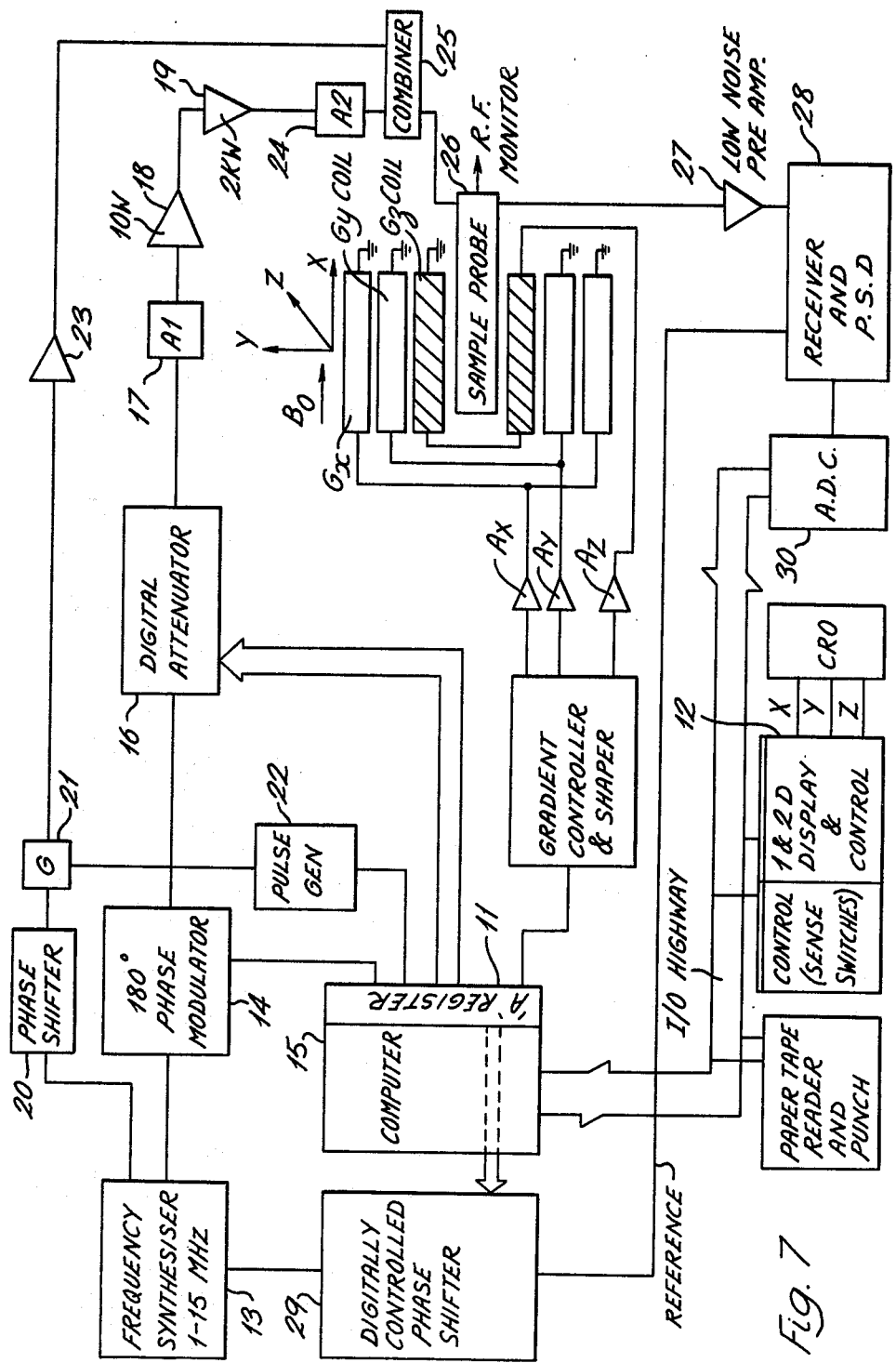
Figure 8:
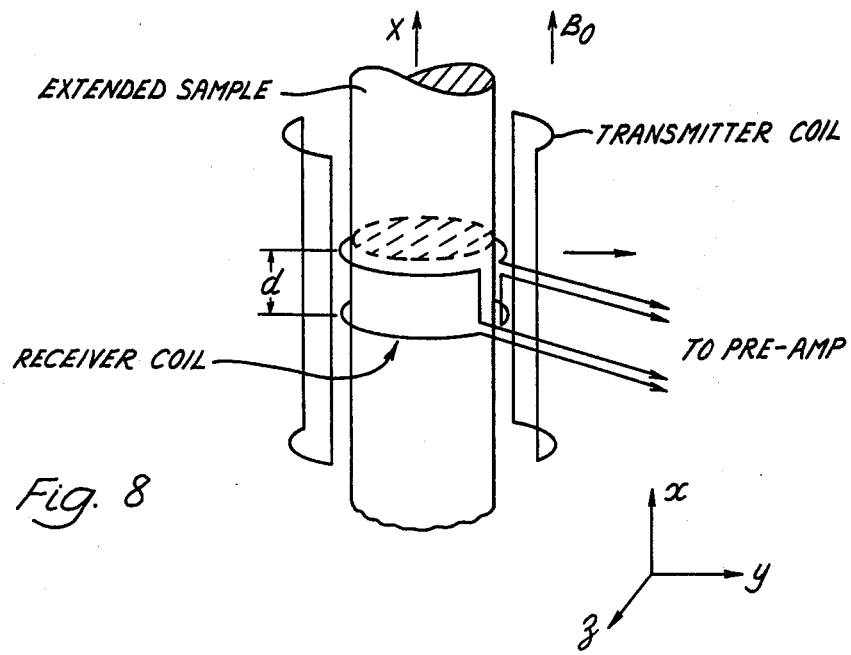
Figure 9:
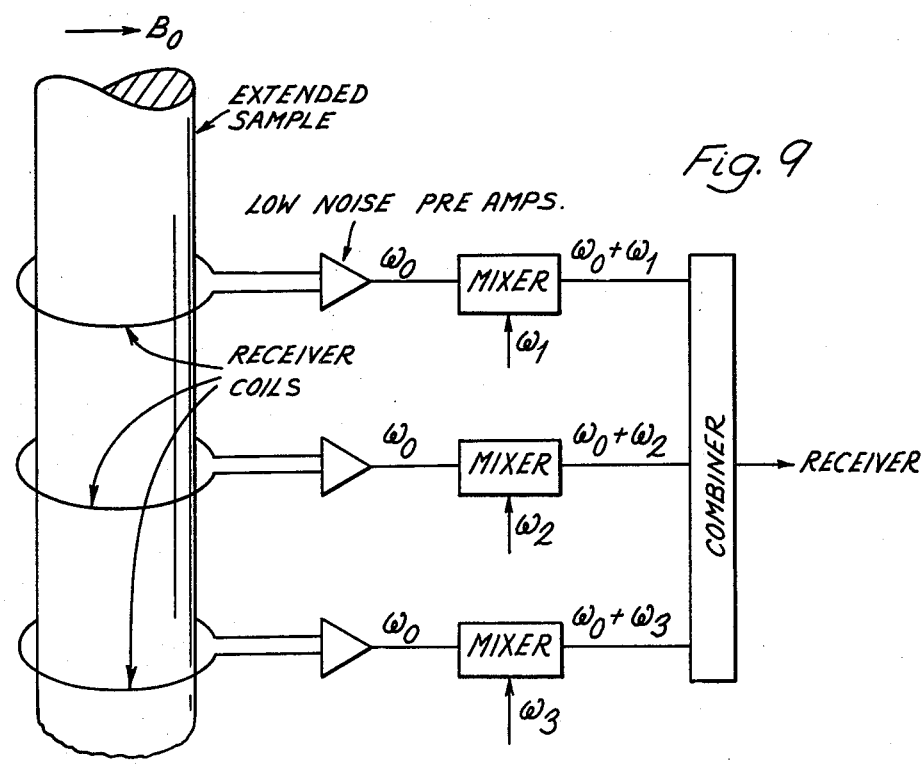
Figure 11:
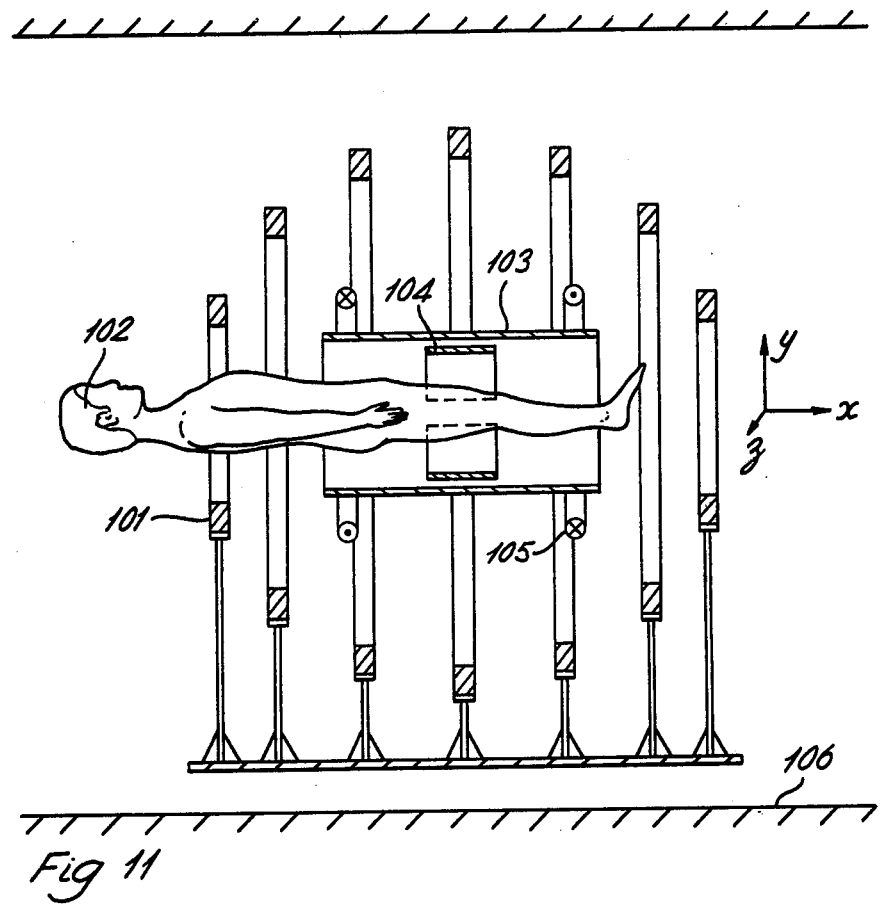

FIG. 3 illustrates the expected Fourier transforms of results for the layer selected as in FIG. 1 under various possible conditions, these being (a) with $G_z=0$ and for a single FID (b) with $G_z=0$ and for a sequence of echoes, and (c) the transforms for the full experiment, FIG. 4 is a schematic diagram of the full experiment of FIG. 2 followed by a complemenary store operation and showing the resultant signal, FIG. 5 illustrates the switching sequence for obtaining information from a volume, FIG. 6 illustrates expected Fourier transforms of results for a cylindrical volume under various possible conditions, these being (a) with $G_y=G_z=0$, (b) with gradients $G_x$ and $G_y$ applied and $G_z=0$, and (c) the transform from the full experiment, FIG. 7 is a block diagram of apparatus for carrying out the invention, FIG. 8 illustrates an arrangement of transmitter and receiver coils, FIG. 9 illustrates an arrangement of three spaced-apart receiver coils, FIG. 10 illustrates in perspective an arrangement for selective reception from a thin slice, FIG. 11 illustrates in cross-section one arrangement of coils for providing the main and gradient magnetic fields to enable a life-sized object to be examined.

Figure 12:
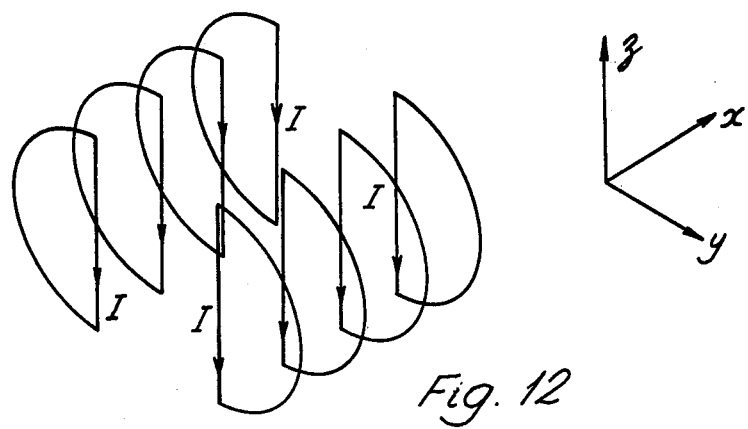
Figure 14:
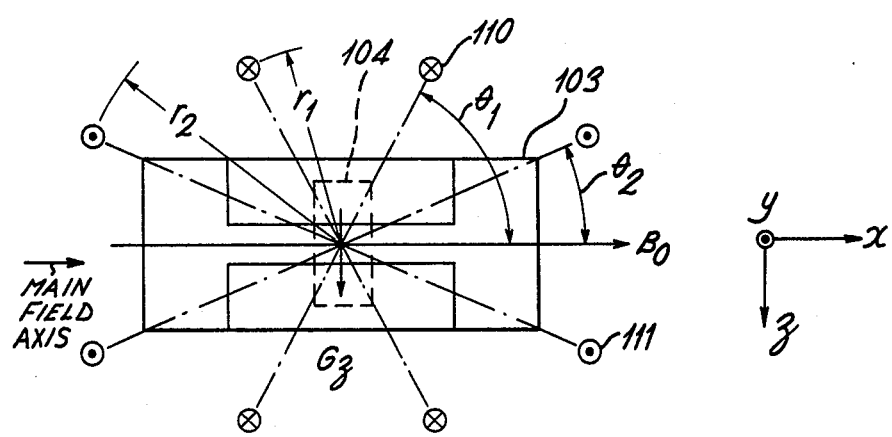
Figure 15:
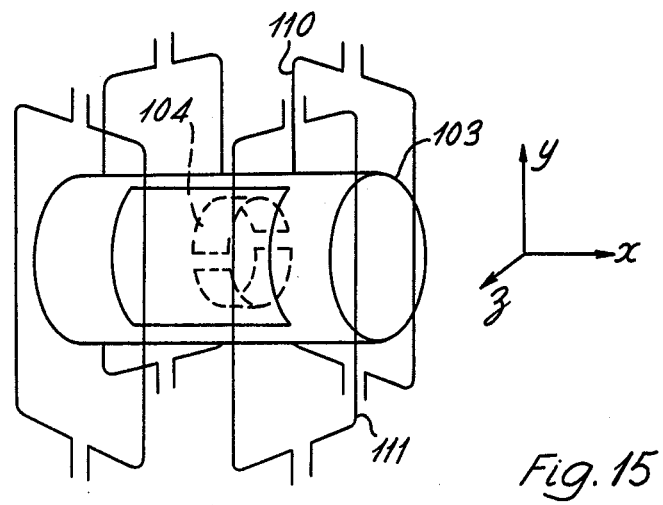

FIG. 12 shows a detail of coils for providing the magnetic field gradient $G_y$, FIG. 13 is a perspective view showing one arrangement of coils for providing all three orthogonal gradients, FIGS. 14 and 15 show in plan and perspective an alternative field gradient coil arrangement using line currents.

Figure 16:
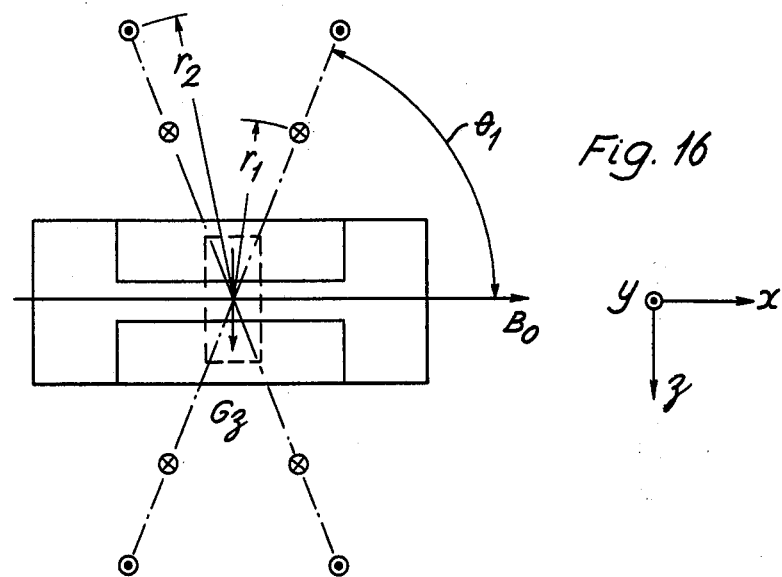
Figure 17:
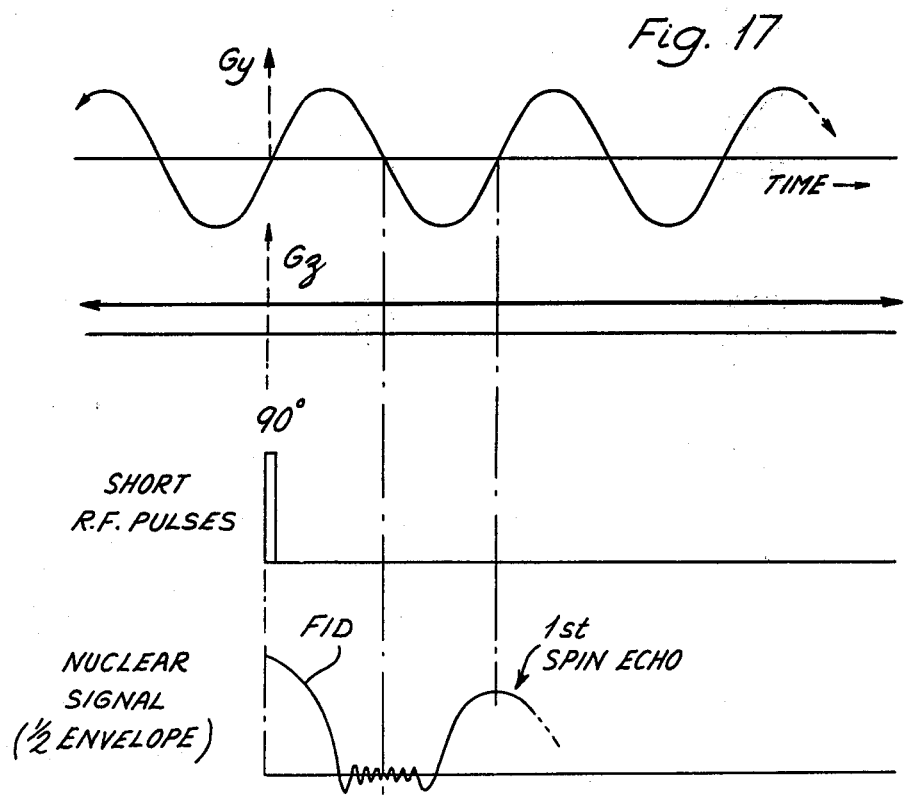

FIG. 16 shows an alternative arrangement to that shown in FIG. 14,

FIG. 17 illustrates waveforms relevant to sinusoidal field variation, and

Figure 18:
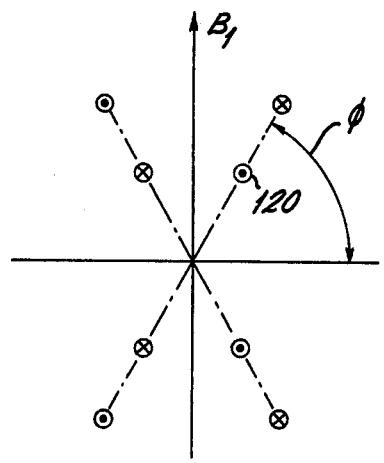
Figure 19:
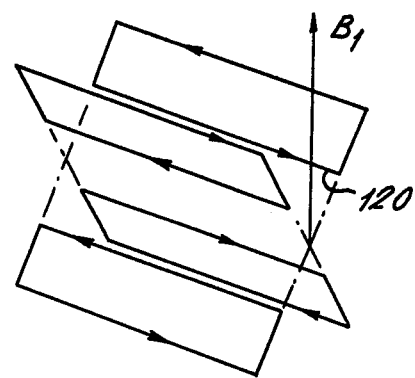

FIGS. 18 and 19 show in plan and perspective an arrangement of coils for providing the transmitter field.

For single plane imaging reference may be had to FIG. 1. The extended specimen is placed in a large static uniform magnetic field $B_o$ which defines the angular resonance frequency $\omega$ of the spins through the relationship $\omega=\gamma B_o$ where $\gamma$ is the magnetogyric ratio. A linear magnetic field gradient $G_x$ is also applied, where $G_x=\partial B_x/\partial x$, and at the same time with a tailored 90° rf pulse which excites all the spins within a single layer of thickness $\Delta x$ at $x_o$ giving a free induction decay (FID) signal. This first step is termed phase A. Immediately following the excitation pulse, the gradient $G_x$ is switched off and the FID is observed in a switched gradient $G_y$ and a steady gradient $G_z$ both as sketched in FIG. 2, where $G_y=\partial B_x/\partial y$ and $G_z=\partial B_x/\partial z$. This second step is termed phase B.

Following the selective excitation pulse in phase A application of $G_y$ only in phase B for time $\tau_b$ will cause the FID to decay. If this single decay signal alone were sampled ($G_x=0$) and Fourier transformed, it would of course yield the projection profile of the spin magnetization in the $x_o$ plane along the z axis. However, by reversing the gradient direction the decayed FID is made to grow into a spin echo in time $\tau_b$ which then decays again in a further time $\tau_b$. Further gradient reversals can thus recall the signal n times provided that $2n\tau_b < T_2$ where $T_2$ is the spin-spin relaxation time of the sample being considered. The positive half of the resulting decay and regrowth of the nuclear signal in phase B is shown in FIG. 2. Now the effect of recalling the signal imposes a discreteness on the Fourier transformed projection profile. The growth data may have to be re-ordered in the Fourier transform. In any event, what was originally a continuous Fourier transform is now a discrete profile with frequency spacing given by $2\pi/\tau_b=\Delta\omega_y$. The expected Fourier transformed signals for the continuous profile from a single FID and the discrete profile from the echo sequence are shown in FIG. 3 at (a) and (b). The finite sampling time $t_b$ will impose some slight broadening on the discrete lines giving a width of approximately $2\pi/t_b$.

In the full experiment, the results of which on transformation are as at (c) in FIG. 3 for a cylindrical sample of uniformly distributed spins the sampling is performed with the additional gradient $G_z$ adjusted in amplitude so that the relationship $$\Delta\omega_y > N\Delta\omega_z \quad (1)$$

is satisfied in which $\Delta\omega_z$ is the angular frequency per point of the final frequency domain data and N is the maximum number of points required to describe the object field along the z axis. Under this condition, the Fourier transform of the FID signal yields a set of resolved cross-sectional profiles of the spin distribution across the disc of magnetization.

These can then be appropriately formed into a rectangular array of data points within a display memory and then output in a television raster display. The signal heights are used to modulate the spot intensity on a black and white display or alternatively the data can be colour coded to form a colour television type picture.

As shown in FIG. 2, the events in the imaging process are drawn as a cycle which includes a time delay $T_d$. Thus in one form of this experiment, the initially disturbed magnetization following the selective pulse P is allowed to recover to its equilibrium value or some intermediate value before re-application of the sequence. This form of the experiment is useful for spin lattice relaxation time discrimination experiments. For faster data accumulation, the delay $T_d$ is removed. If now two cycles are put together back to back, the second being complementary to the first, any signal amplitude loss in time $t_b$ can be recovered to almost the full signal magnetization and stored back along the x axis by application of a $P^{-1}$ pulse and gradient reversal of $G_x$ to $G_{-x}$. In this process $G_z$ is changed to $G_{-z}$ and $G_y$ continues to be switched as in the first cycle. Once the signal magnetization has been stored and a suitable time elapsed in the stored state $T_s$, the process can be repeated. This version of the combined cycles is shown in FIG. 4. The symbol O represents the operations of selection and gradient switching. The symbol O+ is the complementary operation described above necessary to recover the full initial transverse magnetization and also store it back along the x axis.

There will inevitably be some loss of signal due to spin lattice relaxation and possibly defects in the operations O and O+. A store delay time $T_s$ is thus also incorporated to "top up" the equilibrium magnetization. Even so, the full signal height is likely to be less than the static equilibrium value and after the application of a few such cycles will settle down to a new dynamic equilibrium value.

The advantage of this particular form of the cycle is the image's invariance to spin-lattice relaxation processes. A further variant of the imaging cycle sketched in FIG. 2 is based on the steady state free precession (SSFP) method (H. Y. Carr, Phys Rev 112, 1693 (1958) and W. S. Hinshaw J app Phys 47, 3709 (1976). In this case $T_d=0$ and in each pair of adjacent cycles selective and complementary selective rf pulses are used with, in general, nutation angles less than 90°. Again after a few such cycles, a quasiequilibrium state is established but the maximum signal height is much smaller than the static equilibrium value.

The experiment just described can easily be extended to a set of planes by using a multi-spike selective irradiation pulse for P. The gradient $G_x$ is left switched on so that the signals arising from the various planes can be resolved in the frequency domain.

However, such an initial selection pulse is not essential. Instead spatial discrimination can be accomplished entirely with appropriately modulated magnetic field gradients. This is termed three dimensional imaging.

In three dimensional imaging, a short 90° rf pulse which is non-selective is applied to all the spins in the specimen with all three orthogonal gradients $G_x$, $G_y$ and $G_z$ on and modulated as shown in FIG. 5.

Without $G_y$ and $G_z$, the FID is a series of echoes which if suitably Fourier transformed give a series of equally spaced signal spikes arising from the spins in the planes $x=x_0+al$ where a is the lattice spacing and l an integer. The frequency interval between spikes $\Delta\omega_x=\gamma a G_x=\pi/\tau_a$ is as shown at (a) in FIG. 6. If now $G_y$ is switched on and modulated, each spectral line is split into a discrete spectrum corresponding, in the present example, to the discrete projection profile of a cylinder. Each line of a single profile which is shown at (b) in FIG. 6 comes from spins along the strips (lines) $y=y_0+bm$ forming a regular grid in each plane. The grid comprises M strips of spacing b. The frequency interval between adjacent lines within one profile $\Delta\omega_y=\gamma b G_y=\pi/\tau_b$.

If the third gradient $G_z$ is also switched on, but unmodulated as indicated in FIG. 5, the discrete spectra at (b) of FIG. 6 are broadened into a discrete profile of constant amplitude as shown in FIG. 6(c). Each discrete component will have a different width and corresponds to successive cross-sectional views of the spin density distribution through each disc of magnetization in successive layers. Thus in one decay with Fourier transformation the complete three dimensional spin distribution can be measured. As described previously, the data from each plane can be formed into a two dimensional picture representing the density distribution.

Of course with each additional field gradient, there is the possibility of overlap of the various broadened spectra. Thus for proper resolution, the gradients and timings must be chosen so that $$N\Delta\omega_z \leq \Delta\omega_y \leq \frac{\Delta\omega_x}{M} \quad (2)$$

where $\Delta\omega_z=\pi/\tau_c$ is the frequency per point of the transformed data and N, M are the largest integer values of m and n required to span the sample field. It should also be noted that the digital sampling process itself imposes a discreteness along each strip in a particular layer. The points are spaced at a $z=z_0+nc$ (n=integer) where c is the lattice spacing. Thus $$\Delta\omega_z=\gamma c G_z=2\pi/\tau_c.$$

The imaging arrangement of FIG. 5 can be cycled in the ways previously described for single plane imaging. That is to say by adapting the SSFP method using rf excitation pulses with nutation angles less than 90° and with alternate rf pulse phases shifted by 180°. Alternatively, a complete complementary cycle of operations can be arranged following the operations described and sketched in FIG. 5 so that the spin magnetization is almost completely refocussed and then stored back along the x axis. This can be achieved by reversing $G_z$ in a further period $\tau_c$ while continuing with the modulation of gradients $G_x$ and $G_y$. At the end of this second complementary cycle, a complementary 90° rf pulse (180° phase shifted) is applied to all spins thus returning them along the x axis. After a suitable waiting period the whole process may be repeated regularly, establishing a quasi-equilibrium signal amplitude which is largely independent of both $T_1$ and $T_2$ provided that $2\tau_c < T_2$.

In most diagrams sharply switched gradient states are indicated. This is the ideal arrangement but it is in general much easier to switch gradients more slowly. It is in general possible to use a sinusoidal modulation of some or all of these gradients to achieve the desired separation of the spectra into discrete components, particularly for $G_x$ and $G_y$ when $\tau_a < <\tau_b < <\tau_c$ Sinusoidal (or more precisely cosinusoidal) modulation of $G_x$ and $G_y$ is shown by dotted lines in FIG. 5.

A number of NMR imaging schemes have been described above which allow two or three dimensional spin density information to be unambiguously extracted from single decay signals. Suitable field gradient modulation while observing the FID following selective irradiation offers one possibility of single plane imaging. However, as has already been mentioned if one wishes to avoid selective pulses altogether then it is possible by suitable adjustment of the amplitudes and modulation of the read gradients to extract the desired three dimensional spin density information from a single FID following a conventional short 90° or in general θ° rf pulse. Since all spins contribute to the observed signals, this method of imaging is faster than other planar imaging methods based solely on selective irradiation. In addition, there may well be technical advantages to not using selective pulses. Indeed with sinusoidal gradient modulation the system described herein is technically a very simple imaging method. Square gradient modulation may also be fairly easy to accomplish particularly with energy conserving switching currents. The conceptual differences between what is described here and other gradient modulation imaging methods lie in the recognition of the resolution relationships Eq (1) and Eq (2) in which field gradients of particular values must be applied during the signal read period. Also the modulation frequency periods $\tau_a$, $\tau_b$ and the unmodulated gradient period $\tau_c$ must be specially chosen if the experiment is to work. The field gradient modulations are also coherently related in the experiments described though in practice the precise phasing of these modulations may not be so important. Other methods of imaging which use gradient modulation do not allow planar or multiplanar images to be produced, only images formed point-by-point or line-by-line.

The effect of gradient switching in the sequence of FIG. 2 is best understood if the condition when $G_z=0$ is studied. Suppose that in a time $\tau_b$ a steady gradient $G_y$ has caused the FID amplitude to decay completely to zero. If this decay alone were sampled and Fourier transformed it would of course yield the projection profile of the spin distribution along the y axis in the $x_o$ plane. However, by reversing the gradient direction (or by applying a 180° rf pulse) the decayed FID signal can be made to grow into a spin echo in a further time $\tau_b$ which then decays again. Further gradient reversals can thus recall the signal P times provided that $t_b = 2P\tau_b < T_2$, where $T_2$ is the spin-spin relaxation time of the specimen. Recalling the signal in this way and sampling the full spin echo train imposes a discreteness on the Fourier transformed projection profile. The discrete frequency spacing is given by $\Delta\omega_y = \pi/\tau_b$. The finite sampling time $t_b$ introduces some slight broadening on the discrete lines giving them all an angular frequency width of approximately $2\pi/t_b$. External shaping of the spin echo train gives the possibility of further broadening the discrete lines into rectangular or other desired profiles.

In the full two dimensional experiment signal sampling is performed with the additional steady gradient $G_z$ which broadens the individual discrete lines to yield for a single echo train plus Fourier transformation a complete set of resolved cross-sectional profiles of the spin distribution across the thin layer in the specimen. The profiles can then be appropriately formed into a rectangular array of data points within a computer memory and then output in a television display to form a visual image.

In a generalisation of this experiment to three dimensions, a multi-planar selection process can be incorporated by modulating both $G_x$ and $G_y$ while maintaining $G_z$ steady. In this case, the initial selective excitation pulse can be replaced by a conventional non-selective 90° (or θ°) rf pulse. As shown in the following analysis, the effect of gradient switching together with digital sampling of the signal is to impose on an otherwise continuous spin density distribution a discrete lattice point distribution with spatial periodicities a, b and c.

The FID signal in the rotating frame at time t following the pulse is given by $$S(t) = r_p \iiint \rho(x,y,z)\exp\left[ i\gamma \int_0^t (xG_x(t') + yG_y(t') + zG_z(t'))dt' \right]dxdydz \quad (3)$$

where $\rho(x,y,x)$ is the continuous spin density distribution of the sample and $\gamma$ is the magnetogyric ratio.

First consider the effect of the time dependent x-gradient alone in Eq (3) and write the integral over x as a new function f(y,z,t). If $G_x(t)$ is periodic, modulo $2\tau_a$, then we have $$f(y,z,t) = \int dx \rho(x,y,z)\exp\left[ i\gamma \int_0^t xG_x(t')dt' \right] \quad (4)$$
$$= \sum_{p=0}^N f(y,z,(t - 2p\tau_a))$$

If the modulation is square wave and $\gamma_a$ is chosen to be long enough for the FID to decay to zero amplitude, then with $G_y = 0 = G_z$ equation (4) integrated over y and z yields a spin echo train. When all three gradients are applied with appropriate square wave modulation, the density $\rho(x,y,z)$ may be written as a function of angular frequency $\rho(\omega_x,\omega_y,\omega_z)$. For large N, the Fourier transform of f(y,z,t) becomes therefore $$F(\omega_x,\omega_y,\omega_z) = \sum_{1=-\infty}^{\infty} \rho(1\Delta\omega_x,\omega_y,\omega_z) 2\pi a \delta(\omega_x - 1\Delta\omega_x) \quad (5)$$

where $\delta(\omega_x - 1\Delta\omega_x)$ is the Dirac delta function.

A similar transformation with respect to the integral over y introduces a second delta function $\delta(\omega_y - m\Delta\omega_y)$. In both delta functions l and m are integers and the angular frequency intervals between points are given by $$\Delta\omega_x = \pi/\tau_a = \gamma a G_x \qquad (6)$$

etc. The inverse Fourier transform of Eq (5) when substituted back into Eq (3) together with the corresponding substitution for the y integrand, yields finally $$S(t) = \left(\frac{ab}{\gamma G_z}\right) \sum_{l,m} \int d\Omega(l,m) \rho[\Omega(l,m)] \cos\Omega(l,m)t \qquad (7)$$

where the angular frequency $\Omega(l,m)$ is given by $$\Omega(l,m) = l\Delta\omega_x + m\Delta\omega_y + \omega_z \qquad (8)$$

Digital sampling of S(t) for a time $\tau_c$ introduces a discreteness along the z axis. The points are spaced at $z = z_o + nc$ (n integer) which corresponds to an angular frequency interval $\Delta\omega_z = 2\pi/\tau_c = \gamma c G_z$. Taking this into account Eq (7) can be rewritten as the discrete sum $$S(t) = \Sigma \rho_{lmn} \cos t[l\Delta\omega_x + m\Delta\omega_y + n\Delta\omega_z]\Delta\nu_{lmn} \qquad (9)$$

where $\Delta\nu_{lmn} = abc$ is the unit cell volume the spins of which contribute to the signal at each lattice point. If the modulation periods (and hence the gradients) are chosen so that $$\Delta\omega_x/M = \Delta\omega_y = N\Delta\omega_z \qquad (10)$$

where M and N are the largest values of m and n respectively in the imaging field, then from Eq (9) all points in the distribution $\rho_{lmn}$ are uniquely defined in the frequency domain. Fourier transformation of S(t) in Eq (9) will thus yield in one calculation the complete three-dimensional spin density distribution function $\rho_{lmn}$. This may be referred to as Fourier transform nesting and in effect it converts a three (or two) dimensional transformation to one dimensional form.

Provided the conditions on gradient amplitude and periodicity are maintained, it is straightforward to see from Eq (3) that the square waveform of the field gradient modulations may be replaced by cosine waveforms to good approximation. For optimum working of this experiment, the gradient modulations must be phase coherent.

If the time saving gains are to be effective in planar imaging, the complete signal sampling cycle must be repeated frequently so that data acquisition approaches a continuous process for signal/noise ratio enhancement purposes. The coherent nature of the method described lends itself to the incorporation of complementary store cycles along the lines of the driven equilibrium Fourier transform (DEFT) technique for signal averaging or the steady state free precession (SSFP) technique both methods making signal observation essentially independent of spin lattice relaxation effects if required.

Apparatus for carrying out the invention is shown in FIG. 7. The apparatus consists of a computer controlled pulse spectrometer, which operates at 1-15 MHz for example. Control is effected via the I/O highway of, for example, a Honeywell 316 computer 15 and a further route via an accumulator or A-register 11. In addition to the normal input/output facility for the computer, a one and two dimensional display 12 which allows sections of the memory core to be interrogated is provided.

The spectrometer consists of two independent r.f. channels; a low power and a high power channel, both driven from a common 1-15 MHz frequency synthesizer 13.

Low power signals pass through a switched 180° phase modulator 14, a digital attenuator 16 and fixed attenuator 17 to a broad band 10 W driver amplifier 18. The digital attenuator 16 may have any convenient number of levels and can be an analogue attenuator with digital control. The output from the 10 W amplifier 18 is finally amplified in a 2 kW linear amplifier 19. Attenuator 17 is adjusted so that the r.f. amplitude covers the full linear range of the power amplifier 19.

In the second high power channel, low level signals pass through a variable phase shifter 20 and gate 21 which is opened by pulse generator 22. Signals from the gate are then amplified up to almost 5 KW in an amplifier 23.

The two channels are combined in a combiner 25 and fed to the transmitter coil of the probe. An attenuator 24 is used to control the final power level in the low power channel.

An indicated in FIG. 7, the 180° phase modulator 14, pulse generator 22 and digital attenuator 16 are controlled by bit patterns generated in the A-register 11 of the computer.

Nuclear signals from the probe 26 are fed via a low noise preamplifier 27 to the receiver 28 where they are phase-sensitively detected relative to a reference input derived from the frequency synthesizer. Both the in-phase and quadrature signals can be sampled. The receiver reference phase may be shifted under computer control by passing the reference signal through a digitally controlled phase shifter 29. This is done to correct the signal phase variations arising in the echo sequence. In other words the r.f. phase of each echo in a $2\tau_b$ period (see FIG. 2) may be corrected. The relevant phase angle error is fed in binary form to the phase shifter "on the fly". An alternative and slower procedure is to convert the Fourier transformed signal profile for phase in the frequency domain by a Fourier rotation program. This is essentially a software procedure whereas the first method above is a hardware procedure and therefore much faster. The detected signals are then converted to digital form in the analogue-to-digital converter (ADC) 30 and fed into appropriate locations in the computer core for signal averaging and processing.

The probe 26 consists of a cross coil arrangement as shown in FIG. 8. The large saddle-shaped transmitter coil produces a uniform r.f. field over most of the sample contained within it. For an extended sample as shown there will be regions of the sample which do not receive the full r.f. magnetic field. However, by confining received signals to a second saddle-shaped coil, which is orthogonal to the transmitter coil and is fairly flat, it will pick up spatially localised signals within about $\pm d$ above and below the coil plane where d is the receiver coil thickness. These regions will thus have received the full r.f. level from the transmitter pulse. Naturally, the receiver coil thickness can be extended to include the desired volume in whole volume imaging. An added advantage of the cross-coil assembly is receiver protection. The receiver coil may be cooled to improve the signal/noise ratio.

If several planes of spins are selected and excited by a selective irradiation pulse then it is possible to differentiate the signals from each plane by leaving the gradient $G_x$ switched on and unmodulated during the selection phase. However the finite thickness of the layers may lead to difficulties if $G_x$ is left on. If $G_x$ is switched off during the selecting operation there is no frequency selectivity in the x direction. However there is spatial selectivity. Provided the selected planes of disturbed spin magnetisation are suitably spaced it is possible to position a corresponding set of receiver coils aligned with these planes and which respond individually to the signals from the selected planes. Such an arrangement is shown in FIG. 9 in which three separate receiver coils are provided spaced apart from each other in the x direction. For this particular receiver geometry, $B_o$ must lie in a plane parallel to the receiver coil planes. Of course, with $G_x$ switched off, all planes resonate at the same Larmor frequency. If the coils are separate as shown and are each fed into separate receivers and mixers the effective centre frequencies for each plane of spins can be arbitrarily shifted thus allowing frequency resolution or discrimination of the Fourier transformed data.

With this scheme it might be appropriate not to deal with more than three or so layers at once. The success of this arrangement depends on the degree of isolation between adjacent coils. The activated sample within one coil should not produce a significant signal in adjacent coils. For this to hold the intercoil spacing should be approximately equal to the coil radius. An extension of this idea is to use localised signal reception by means of a flux guide receiver. By this means reception of signals can be localised to a thin layer of, say, 2 cm thickness. The advantage is that non-selective 90° pulses may be used to excite spins in an initially thick layer, but reception is limited to a thin sheet. In this type of flux guide reception a split conducting metal block of fabricated sheet whose thickness is much greater than the r.f. penetration depth is arranged in pipe-like fashion to carry the magnetic flux so as to pass through an adjacent tuned receiver coil. Only signals originating within the area of the flux guide entrance cavity will be captured and contribute to the observed signal. The entrance orifice may be shaped, for example as a rectangular slit, to localise reception. Signals from outside the entrance orifice will not thread their flux through the receiver coil because the signal cannot penetrate the metal cavity walls.

A flux guide receiver for use with this invention is illustrated in perspective in FIG. 10. A patient 40 lies horizontally and receiver end pieces 41 and 42 are positioned above and below him. The end pieces are formed of fabricated sheet and have narrow slits at their tips which extend across the full width of the body of a patient and define gaps of about 2 cm. The end pieces extend through pipe-like guides 43 and 44 which are cranked to give room for the patient's body and are connected to a bridging member 45 extending vertically between the guides. The bridging member has a cavity in which a receiver coil 47 is wound and the cavity has a longitudinal split. The direction of the main field as indicated by the arrow $B_o$ is longitudinally of the patient while the transmitter field is orthogonal to that direction and is indicated by the arrow $B_1$.

As shown in FIG. 11 in cross-section, the static magnetic field Bo is provided by an electromagnet comprising a set of coils 101 approximating to the shape of a sphere. For whole-body imaging the disposition of a patient 102 (for example) is shown. The patient is positioned within a pair of formers 103 and 104 on which the transmitter and receiver coils are separately wound. The supporting structure should be non-ferrous and as open as possible to avoid eddy current problems with the pulsing or active gradient coils. An alternative disposition of the patient is when he is turned through 90° so as to be upright, and with the static field direction along the x axis as before. In this case an even number of coil sections 101 is required, leaving the mid-plane free for the patient. Of course if the inner magnet diameter is large enough the patient may sit up inside or kneel entirely within the magnet volume.

The magnetic field gradient $G_x$ is produced by a reversed Helmholtz pair of coils 105 situated outside the formers carrying the r.f. transmitter and receiver coils. In one arrangement the magnetic field gradients $G_y$ and $G_z$ are each produced by a coil arrangement sketched in FIG. 12 which shows an arrangement for $G_y$ only. Eight lines all carrying the same current I are appropriately spaced apart on a former. The current return paths take the D shape indicated. A similar coil structure and arrangement, rotated through 90° is provided for the magnetic field gradient $G_z$. It may under certain circumstances be possible to use just four line currents. Alternatively the number of D shaped units may be increased to more closely approximate to a current sheet.

The whole apparatus may be placed within a $\mu$-metal cylinder or rectangular box 106 to shield from extraneous magnetic fields and variations in static field due to external movements of metallic objects. The shield may not be necessary in all cases. The design of the main static field coils is optimised for homogeneity with the boundary conditions determined by the screen. FIG. 13 shows one arrangement of the $G_x$ gradient coils 105, four each of $G_y$ and $G_z$ gradient coils 107 and 108 the transmitter coil and former 103 within the main coils. The patient slides through the former 103 as in FIG. 11. The orthogonal receiver coil and former 104 and the remainder of the $G_y$ and $G_z$ gradient coils are not shown in FIG. 13 in order to simplify the figure.

An alternative arrangement of conductors for providing one of the magnetic gradients $G_y$ or $G_z$ is shown in FIG. 14 and FIG. 15. The arrangement that is illustrated provides the $G_z$ gradient and a similar arrangement to that shown but positioned orthogonally will be provided for the $G_y$ gradient, while the $G_x$ gradient is provided by a reversed Helmholtz coil arrangement (not shown) as in FIG. 11 and FIG. 13. The $G_z$ gradient producing arrangement comprises a set of current carrying conductor lines 110 all parallel to each other and positioned relative to the transmitter former 103 in the manner shown. These may be different values of current flow in all of the lines but where two or more of the lines carry equal currents they can be connected in parallel across a common current source. Where two of the lines carry equal and opposite currents then they can be connected in a closed loop to form a coil.

The gradient coil designs of FIGS. 14 and 15 are based on the calculations for infinitely long wire arrays and in this case for best uniformity of gradient the optimum angles between the x axis and the line joining the centre of the structure to the various wires has been calculated to be 22.5° or 67.5°. For finite length conductors, as in a real apparatus, the actual angles may differ from the above stated values by a degree or so and can be found empirically. The four gradient producing wires 110 have their current directions indicated in FIG. 14 by crosses and present angles $\theta 1 = 67.5°$ to the x axis. The four return wires 111 carrying current in the opposite direction, as represented by dots inside circles, present angle $\theta 2 = 22.5°$ to the x axis.

An alternative arrangement to that shown in FIGS. 14 and 15 is shown in FIG. 16 where all of the wires comprising both the forward current paths and the return paths are positioned along lines at an angle of $\theta_1 = 67.5°$ to the x axis.

Although the values of the angles $\theta_1$ or $\theta_2$ are important the radial distances $r_1$ for the forward current wires and $r_2$ for the return current wires are more arbitrary. The gradient at the centre of such a set of infinitely long wires is given by $$G_z = \frac{2\mu_o I}{\pi} \left( \frac{\cos\theta_1}{r_1^2} - \frac{\cos\theta_2}{r_2^2} \right)$$

where I is the current and $\mu_o$ is the permeability of free space. From the above relationship it will be seen that for the largest gradients $r_2$ will tend to infinity. A compromise must be found in practice and the value of $r_2 = 3r_1/2$ may be used which reduces $G_z$ to 5/9 of the value when $r_2$ is infinite.

The switching of the gradient coils is controlled by the computer via the control and shaping facility of FIG. 7. For proper working of the experiment the modulation periods of the gradients $G_z$ and $G_y$ should be related by the integer relationship given previously. This means that for example, in the three dimensional gradient modulation imaging method, for every 64 periods $2\tau_a$ of $G_x$, $G_y$ must switch through one period $2\tau_b$. Similarly, 64 periods of $G_y$ must equal the time $\tau_c$. The controller thus can comprise suitable programmable scalers or counters to ensure the above integer relationships. Alternatively all counting can be performed within the computer. If the switched mode is not required, the shaper shapes the square modulations to a cosine, or other desired waveform. This can be done either by analogue means or by digital synthesis. The shaping may be performed at low voltage level and each shaped gradient signal would then be fed through linear D.C. current amplifiers to produce the gradient currents. The amplifiers must be capable of negative as well as positive current outputs i.e. they should be bipolar.

The approximate spacing of the $G_x$ coils in FIG. 13 has been given by Tanner (Rev. Sci. Instr. 36 1086-7 (1965)). For finite bundles of wires, however, it is better to optimise the gradient uniformity numerically. The coil spacings for the gradients $G_y$ and $G_z$ for four line currents disposed similarly to FIGS. 14, 15 and 16 have already been discussed, but for return paths in the form of 'D's as described with reference to FIG. 11 the coil spacings should be optimised numerically to give best linearity of the gradients. For more than four line currents i.e. for the current sheet approximation it is best to numerically optimize using the Biot-Savart law.

One of the problems likely to be encountered in any of the schemes previously described, is the electrical problem of switching on or off large currents in the field gradient coils. Even when the currents are cosine modulated, as in FIG. 5, there is an additional problem of r.f. pulsing in those schemes which use non-selective 90° r.f. pulses. Either the r.f. pulse has to be of very high power $(B_1 >> x_{max}G_x, y_{max}G_y, z_{max}G_x)$ or a lower power pulse is applied to the specimen before the gradients are switched on. Naturally, this cannot be done in schemes employing selective pulses. But there are advantages to developing imaging schemes which do not use selective excitation pulses at all. They are generally faster, the time saving coming from the difference in the irradiation pulse lengths.

In the scheme described earlier in which planar selection is performed with a flux guide receiver, and also in the multiplanar scheme, an initial non-selective 90° pulse may be applied. However, as illustrated in FIG. 5 and discussed above, without very high power r.f. pulses, the gradient must be quickly stepped to the initial cosine peak and this is as difficult to achieve as switching on a square wave modulation. Of course for cosine modulation it is only necessary to achieve rapid switching once, whereas for the square wave modulation rapid switching must be repeated and if there are any intrinsic errors introduced by each switching process, these will propagate. Not so with cosine modulation. To avoid even the initial step a modified scheme may be employed in which a sine modulation of the gradients is used together with a non-selective 90° pluse applied when the modulated gradient is zero. The arrangement of gradients and r.f. pulse for a single plane imaging scheme is shown in FIG. 17. The sine modulated $G_y$ gradient is on continuously and therefore poses no switching problems. So also is the smaller unmodulated broadening gradient $G_z$.

The nuclear signal following a short 90° pulse will be modulated in time so that its Fourier transform will not yield the usual projection profile of the sample as obtained in a static gradient. Because of the time dependence introduced by the sine modulation of $G_y$, it will be necessary to perform a non-linear or Bessel transformation in order to relate the FID to the desired profile. Repeated recalling of spin echoes and complete sampling of the spin echo train will, on Bessel transformation, yield a discrete profile as in the case of switched gradients. The important point here is that provided the form of the gradient modulation is known (preferably in analytical form) the requisite transformation can always be performed to recover the profile. Steady gradients are a special case.

The just described scheme may be applied to single plane or three dimensional imaging without relying on flux guide reception or on a third modulated gradient to define a single plane, or set of planes, along the x-axis. Yet another variant is to apply non-selective pulses and gradient modulation as described above to produce a thick cross-sectional picture. The thickness is determined by the spatial response function of the receiver coil. A set of such pictures is produced by advancing the specimen stepwise through the receiver coil along the x-axis. By taking corresponding points from each successive picture (i.e. at same y, z co-ordinates) a deconvolution along the x-axis may be performed using the receiver coil spatial response function. This process will yield a true thin slice distribution in any plane x. The slice may be thickened by reconvoluting with a square spatial function along the x-axis, thus allowing a compromise between spatial resolution along x and signal-to-noise ratio.

The same principle used in the design of the gradient coils can also be used to design an r.f. transmitter coil. Here a uniform magnetic field over the largest possible volume is required. This may be created from four infinitely long wires 120 disposed shown in plan in FIG. 18 and in a perspective view in FIG. 19. The wires 120 are arranged to produce a magnetic field $B_1$ in the direction of the arrow and the angle $\phi$ between a line joining the wires to the centre of the structure and the z-axis for optimum uniformity of the $B_1$ field should be either 30° or 60°. To maintain the homogeneity of the transmitter field the current return paths should also make the same angles as shown. In practice with finite conductor lengths the forward and return paths can conveniently be formed into closed rectangular loops as shown in FIG. 19.

I claim:

1. A method of obtaining signals representing the nuclear magnetic resonance spin density distribution in a sample which comprises maintaining a static magnetic field along one axis of a sample, applying an excitation pulse to the sample, applying at least one magnetic field gradient to said magnetic field which varies in a direction selected from directions orthogonal to and parallel to said one axis and repetitively reversing the direction of one or more of the said at least one magnetic field gradient at a rate which allows cyclic regrowth and decay of the free induction decay (FID) signal from the sample, and reading out the resulting FID signal.

2. The method as claimed in claim 1 in which simultaneously with said excitation pulse a magnetic field gradient is applied along said one axis.

3. The method as claimed in claim 1 in which the excitation pulse is a selective excitation pulse and the said at least one magnetic field gradient which varies in a direction orthogonal to the first magnetic field gradient is applied subsequently to the said selective excitation pulse.

4. The method as claimed in claim 3 in which the said selective excitation pulse is such that in combination with the said first magnetic field gradient a slice of the specimen lying in a plane perpendicular to the said one axis is selected and the said first magnetic field gradient is removed on termination of the pulse.

5. The method as claimed in claim 3 in which the said selective excitation pulse is such that in combination with the said first magnetic field gradient a set of slices of the specimen lying in planes perpendicular to the said one axis is selected and the said first magnetic field gradient is maintained during subsequent steps.

6. The method as claimed in claim 4 in which two magnetic field gradients varying in respective directions orthogonal to the said first magnetic field gradient are simultaneously applied and one of the said two magnetic field gradients is repetitively reversed.

7. The method as claimed in claim 6 in which the sequence of steps is repeated with an excitation pulse of opposite phase and the directions of the said first magnetic field gradient and the other of said two magnetic field gradients are reversed.

8. The method as claimed in claim 1 in which the excitation pulse is a non-selective pulse and a combination of three magnetic field gradients varying in respective directions along and orthogonal to said one axis are applied, and wherein the directions of two of the said gradients are repetitively reversed.

9. The method as claimed in claim 8 in which the repetitive reversal of the directions of the two of the said gradients are at differing rates.

10. The method as claimed in claim 1 in which subsequent reversals of magnetic field gradient have periods double the period in which a gradient is first maintained.

11. The method as claimed in claim 1 in which the repetitive reversal of the directions of magnetic field gradients is progressive in a cosinusoidal fashion.

12. The method as claimed in claim 1 in which the repetitive reversal of the directions of the magnetic field gradients is progressive in a sinusoidal fashion.

13. Apparatus for obtaining signals representing the nuclear magnetic resonance spin density distribution in a sample which comprises means for providing a static magnetic field along one axis of a sample, means for applying an excitation pulse to the sample, means for applying magnetic field gradients to said magnetic field which vary in directions along and orthogonal to the said one axis, means for repetitively reversing the direction of at least one magnetic field gradient and means for reading out the resulting free induction decay (FID) signal.

14. Apparatus as claimed in claim 13 in which the means for reading out the resulting FID signal includes a plurality of receiver coils each selective to individual slices of the sample and spaced apart from each other in the direction of said one axis.

15. Apparatus as claimed in claim 13 in which the means for reading out the resulting FID signal includes a flux guide receiver selective to flux from a slice of the sample lying in a plane perpendicular to the said one axis.

16. Apparatus as claimed in claim 13 in which the means for providing a static magnetic field comprises a set of coils which together approximate to the shape of a sphere.

17. Apparatus as claimed in claim 16 in which the means for applying a magnetic field gradient to said magnetic field which varies along said one axis comprises a pair of coils connected as a reversed Helmholtz pair and positioned within said sphere.

18. Apparatus as claimed in claim 16 in which the means for applying a magnetic field gradient to said magnetic field which varies in a direction orthogonal to said one axis comprises two rows of parallel conductors which extend in a direction at right angles to said orthogonal direction and which are spaced apart in the direction of said one axis and all of which carry current in the same direction.

19. Apparatus as claimed in claim 16 in which the means for applying a magnetic field gradient to said magnetic field which varies in a direction orthogonal to said one axis comprises four pairs of parallel go and return line conductors symmetrically positioned about a common point on said one axis and extending in a direction at right angles to said orthogonal direction, the lines joining the go conductors to said point all making equal angles with said one axis and the lines joining the return conductors to said point all making equal angles with said one axis.

20. Apparatus as claimed in claim 19 in which the two sets of equal angles are complementary to each other.

21. Apparatus as claimed in claim 19 in which the two sets of equal angles are equal to each other.

* * * * *